United States Patent [19]
Sugawara

[11] Patent Number: 5,982,218
[45] Date of Patent: Nov. 9, 1999

[54] INPUT CIRCUIT PROVIDED IN A SEMICONDUCTOR INTEGRATED CIRCUIT, USED IN HIGH-SPEED SMALL-AMPLITUDE SIGNAL TRANSMISSION SYSTEM

[75] Inventor: Michinori Sugawara, Tokyo, Japan

[73] Assignee: NEC Corporation, Tokyo, Japan

[21] Appl. No.: 08/888,928

[22] Filed: Jul. 7, 1997

[30] Foreign Application Priority Data

Jul. 4, 1996 [JP] Japan ................................ 8-174851

[51] Int. Cl.⁶ .............................................. H03K 19/0185
[52] U.S. Cl. ........................ 327/333; 327/319; 327/170; 327/108; 326/30; 326/21; 326/23; 326/81
[58] Field of Search ................................ 327/108, 333, 327/143, 319, 205, 206, 427, 170; 326/21, 24, 30, 80, 62, 63, 68, 81

[56] References Cited

U.S. PATENT DOCUMENTS 5,352,942  10/1994  Tanaka et al. ............................ 326/21

FOREIGN PATENT DOCUMENTS 0 655 839 A2   5/1995   European Pat. Off. .
403230612     10/1991   Japan ........................................ 326/30
7-153908       6/1995   Japan .

*Primary Examiner*—Dinh T. Le
*Attorney, Agent, or Firm*—Foley & Lardner

[57] ABSTRACT

An input circuit provided in a semiconductor integrated circuit, comprises an nMOS transistor having a source connected to an input node receiving a transmission signal, a drain connected to a first node and a gate connected to a reference potential, and a pMOS transistor having a source connected to a power supply voltage, a drain connected to the first node, a first inverter having an input connected to the first node and an output connected to an output terminal, and a second inverter having an input connected to the first node and an output connected to a gate of the pMOS transistor, so that when the nMOS transistor is turned on, the pMOS transistor is rendered off, whereby no steady input current flows.

10 Claims, 7 Drawing Sheets

INPUT CIRCUIT PROVIDED IN A SEMICONDUCTOR INTEGRATED CIRCUIT, USED IN HIGH-SPEED SMALL-AMPLITUDE SIGNAL TRANSMISSION SYSTEM

BACKGROUND OF THE INVENTION

1. Field of the Invention

The present invention relates to a semiconductor integrated circuit, and more specifically to an input circuit provided in a semiconductor integrated circuit, used in a high-speed small-amplitude signal transmission system for transmitting a high-speed small-amplitude signal through a signal transmission line on a printed circuit board.

2. Description of Related Art

A digital computer includes a plurality of VLSI circuits, which are bi-directionally coupled with a binary communication network through a transmission line of a single segment or a multi-segment. Generally, the transmission line is constituted of a track which is formed on a printed circuit board and which has an input/output interface provided at each of opposite ends thereof. On the other hand, conventional VLSI circuits are formed by a CMOS technology. However, in an input/output interface of a conventional TTL level, if the frequency of the transfer data exceeds 50 MHz. the influence of signal reflections and crosstalk becomes large, with the result that waveform distortion occurs because of ringing and other factors and normal data transfer becomes difficult.

Under this circumstance, other input/output interfaces such as a small amplitude CTT (Center Tapped Termination) and GTL (Gunning Transceiver Logic) in which a signal level on the transmission line is suppressed to 1 V or less have been proposed. In these CTT and GTL, a wiring conductor is terminated at a voltage lower than a power supply voltage, and a driving current of an output circuit is caused to flow through a terminating resistor, so that a signal amplitude of not greater than 1 V is generated across the terminating resistor. With this arrangement, signal reflection is prevented by matching the value of the terminating resistor with a characteristic impedance of the wiring conductor, so that high speed data transmission can be realized. For example, in the GTL rule, an output circuit is formed in the form of an open drain type driver and is matching-terminated, and a terminating voltage $V_{TT}$=1.2 V±5%, $V_{REF}$=0.8 V, an output high level $V_{OH}$=0.8 V+400 mV, an output low level $V_{OL}$=0.8 V−400 mV, an input high level $V_{IH}$=0.8 V+50 mV, an input low level $V_{IL}$=0.8 V−50 mV.

One example of an input circuit included in a semiconductor integrated circuit and used for a high-speed small-signal transmission system is proposed by Japanese Patent Application Pre-examination Publication No. JP-A-07-153908 and European Patent Publication EP-A-0 655 839 (the content of which is incorporated by reference in its entirety into this application) claiming the Convention Priorities based on Japanese patent application for JP-A-07-153908 and two other Japanese patent applications.

Referring to FIG. 1, there is shown a circuit diagram of the prior art input circuit shown in JP-A-07-153908. This prior art input circuit includes an nMOS transistor 101 having a source connected to a transmission signal input terminal 103, a gate connected to an internal reference potential terminal 104 and a drain connected to a node 5, a pMOS transistor 100 having a source connected to a power supply voltage $V_{CC}$, a gate connected to ground $V_{SS}$, and a drain connected to the node 5, and a waveform shaping inverter 102 having an input connected to the node 5 and an output connected to an output terminal 105. The pMOS transistor 100 is provided as a resistor element. This input circuit is characterized in that it can amplify a small-voltage, small-amplitude signal up to high frequencies.

The internal reference potential is generated by an internal reference potential generating circuit 60 as shown in FIG. 2. This internal reference potential generating circuit 60 includes an nMOS transistor 31 having a source connected to a reference voltage input terminal 34, and a gate connected to a drain thereof, a pMOS transistor 30 having a gate connected to the ground $V_{SS}$, a source connected to the power supply voltage $V_{CC}$, and a drain connected to the drain of the transistor 31 and an internal reference potential terminal 35, and a capacitor 33 connected between the drain of the transistor 31 and the reference voltage input terminal 34. Thus, a drain voltage of the transistor 31 is outputted as an internal reference potential $V_{RT}$ from the internal reference potential terminal 35.

Now, an operation of this prior art example will be described with reference to FIGS. 3A, 3B and 3C. FIG. 3A illustrates the input voltage $V_{IN}$ on the transmission signal input terminal 103, and FIG. 3B illustrates the voltage $V_5$ on the node 5. FIG. 3C illustrates the input current $I_{IN}$ flowing through the transmission signal input terminal 103. Here, assume that the power supply voltage $V_{CC}$=3.3 V, the ground voltage $V_{SS}$=0 V, the reference voltage $V_{REF}$=0.8 V, the input high level $V_{IH}$/the input low level $V_{IL}$=1.2 V/0.4 V, the threshold of pMOS transistor=−0.8 V, and the threshold of nMOS transistor=0.8 V.

In this condition, when the transmission signal $V_{IN}$ is equal to the reference voltage $V_{REF}$, the potential $V_5$ on the node 5 becomes equal to the internal reference voltage $V_{RT}$, as will be understood from a symmetrical circuit construction between the circuits shown in FIGS. 1 and 2. If the transmission signal $V_{IN}$ becomes higher than the reference voltage $V_{REF}$, a gate-source voltage of the nMOS transistor 101 becomes small, and an internal resistance of the nMOS transistor 101 becomes large. Therefore, a drain current of the nMOS transistor 101 becomes small, with the result that a drain voltage of the nMOS transistor 101 elevates, so that the potential $V_5$ of the node 5 finally becomes equal to the power supply voltage $V_{CC}$. To the contrary, if the transmission signal $V_{IN}$ becomes lower than the reference voltage $V_{REF}$, the potential $V_5$ of the node 5 finally becomes about 0.6 V which is near to the voltage $V_{IN}$ of the transmission signal. The inverter 102 receives the potential $V_5$ of the node 5, to shape the transmission signal varying between 0.6 V and 3.3 V to an output signal fully swinging between 3.3 V and 0 V.

As seen from FIGS. 3A, 3B and 3C, when the transmission signal $V_{IN}$ is at a low level, the input current $I_{IN}$ constantly flows through the input terminal 103 (here, for convention of explanation, a direction of a current flowing outward from the input terminal is assumed to be a positive direction in FIG. 3C). The reason for this is that since the pMOS transistor 100 is provided as the resistor element in this prior art input circuit, the pMOS transistor is constantly in an ON condition. Therefore, the prior art input circuit disadvantageously consumed a large amount of electric power. This steady current can be reduced by narrowing a gate width of the pMOS transistor or by elongating a gate length of the pMOS transistor. Simultaneously, however, a delay time inevitably increases.

Furthermore, when the transmission signal $V_{IN}$ is at a low level, since the pMOS transistor is in the ON condition, the potential $V_5$ of the node 5 becomes higher than the input low level $V_{IL}$ (0.4 V). According to simulation, the node 5 potential $V_5$=0.6 V, which is higher than the transmission signal $V_{IN}$=0.4 V, by 0.2 V. Therefore, an operation margin of the inverter 102 is reduced, with the result that an erroneous operation is easy to occur due to noise. If the inverter 102 is improved to prevent this problem, a complicated circuit construction is required, which causes various problems including an increased circuit area, an increased delay time and an increased consumed electric power.

Alternatively, in order to prevent the above mentioned potential elevation, it may be considered to make a driving capacity of the nMOS transistor 101 larger than that of the pMOS transistor 100, for example by increasing the gate width of the nMOS transistor 101 or by narrowing the gate width of the pMOS transistor 100 or elongating the gate length of the pMOS transistor 100. However, this causes various inconvenient problems including an increased circuit area, an increased delay time and an increased consumed electric power.

SUMMARY OF THE INVENTION

Accordingly, it is an object of the present invention to provide a input circuit provided in a semiconductor integrated circuit, used in a high-speed, small-amplitude signal transmission system, which has overcome the above mentioned defect of the conventional one.

Another object of the present invention is to provide an input circuit provided in a semiconductor integrated circuit, in which no steady current flows without causing an increase of circuit area, an increase of delay time, or an increase of consumed electric power.

Still another object of the present invention is to provide an input circuit provided in a semiconductor integrated circuit, capable of outputting an output signal having the same level as that of a transmission signal when the transmission signal is at a low level.

The above and other objects of the present invention are achieved in accordance with the present invention by an input circuit provided in a semiconductor integrated circuit, comprising a first transistor of a first conductivity type connected between an input node receiving a transmission signal and a first node and having a control electrode connected to a reference potential, a second transistor of a second conductivity type connected between a power supply voltage terminal and the first node, an inverter having an input connected to the first node and an output connected to an output terminal, and means having an output coupled to a control electrode of the second transistor and responding to at least a potential on the first node for rendering the second transistor non-conductive when the first transistor is conductive.

According to another aspect of the present invention, there is provided an input circuit provided in a semiconductor integrated circuit, comprising a first transistor of a first conductivity type connected between an input node receiving a transmission signal and a first node and having a control electrode connected to a reference potential, a second transistor of a second conductivity type connected between a power supply voltage terminal and the first node, an inverter having an input connected to the first node and an output connected to an output terminal, and means having an output coupled to a control electrode of the second transistor and responding to at least a potential on the first node for making the potential of the first node equal to that of the transmission signal when the transmission signal is at a first level.

The above and other objects, features and advantages of the present invention will be apparent from the following description of preferred embodiments of the invention with reference to the accompanying drawings.

DESCRIPTION OF THE PREFERRED EMBODIMENTS

Figure 4:
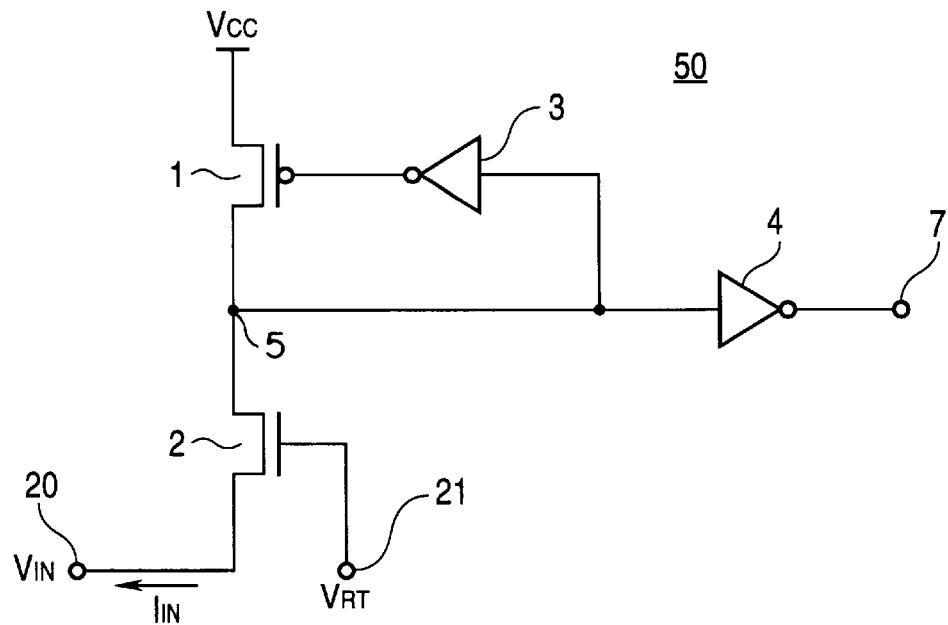
FIG. 4 is a circuit diagram of a first embodiment of the input circuit in accordance with the present invention.

Referring to FIG. 4, there is shown a circuit diagram of a first embodiment of the input circuit in accordance with the present invention.

The first embodiment of the input circuit is generally designated by Reference Numeral 50, and includes an nMOS transistor 2 having a source connected to a transmission signal input terminal 20, a gate connected to an internal reference potential terminal 21 and a drain connected to a node 5, a pMOS transistor 1 having a source connected to a power supply voltage $V_{CC}$ and a drain connected to the node 5, a waveform shaping inverter 4 having an input connected to the node 5 and an output connected to an output terminal 7, and another inverter 3 having an input connected to the node 5 and an output connected to a gate of the pMOS transistor 1 (as a means for controlling the gate of the pMOS transistor 1). An internal reference potential $V_{RT}$ supplied to the internal reference potential terminal 21 is generated by, for example, the internal reference potential generating circuit 60 shown in FIG. 2.

Now, operation of the first embodiment of the input circuit will be described. When the transmission signal $V_{IN}$ supplied to the input terminal 20 is at a low level (lower than the reference voltage $V_{REF}$), a gate-source voltage of the nMOS transistor 2 becomes large, so that an internal resistance of the nMOS transistor 2 becomes small and a drain current of the nMOS transistor 2 becomes large. As a result, a drain voltage of the transistor 2, namely, a potential of the node 5 drops. Therefore, the output of the inverter 3 becomes a high level at a certain timing, so that the pMOS transistor 1 is turned off. Accordingly, the potential of the node 5 becomes equal to the low level of the transmission signal, and on the other hand, the inverter 4 outputs a high level signal. Thus, since the pMOS transistor 1 is turned off, no steady input current $I_{IN}$ flows.

On the other hand, if the transmission signal $V_{IN}$ is brought to a high level (higher than the reference voltage $V_{REF}$), the gate-source voltage of the nMOS transistor 2 becomes small, so that the internal resistance of the nMOS transistor 2 becomes larger and the drain current of the nMOS transistor 2 becomes small. As a result, the drain voltage of the transistor 2, namely, the potential of the node 5 elevates. If the potential of the node 5 exceeds a threshold of the inverter 3, the output of the inverter 3 is brought from the high level to a low level, so that the pMOS transistor 1 is turned on at the moment that the output potential of the inverter 3 drops from the power supply voltage $V_{CC}$ to a potential which is lower than $V_{CC}$ by a threshold voltage of the pMOS transistor (for example, 0.8 V). If the nMOS transistor 2 turns off, the potential of the node 5 goes to a completely completely high level, so that the output of the inverter 3 also goes to a completely low level, and therefore, the pMOS transistor 1 goes fully on. In addition, the output potential of the inverter 4 also goes to a low level. At this time, since an nMOS transistor 2 is turned off, no steady input current $I_{IN}$ flows.

Figure 5:
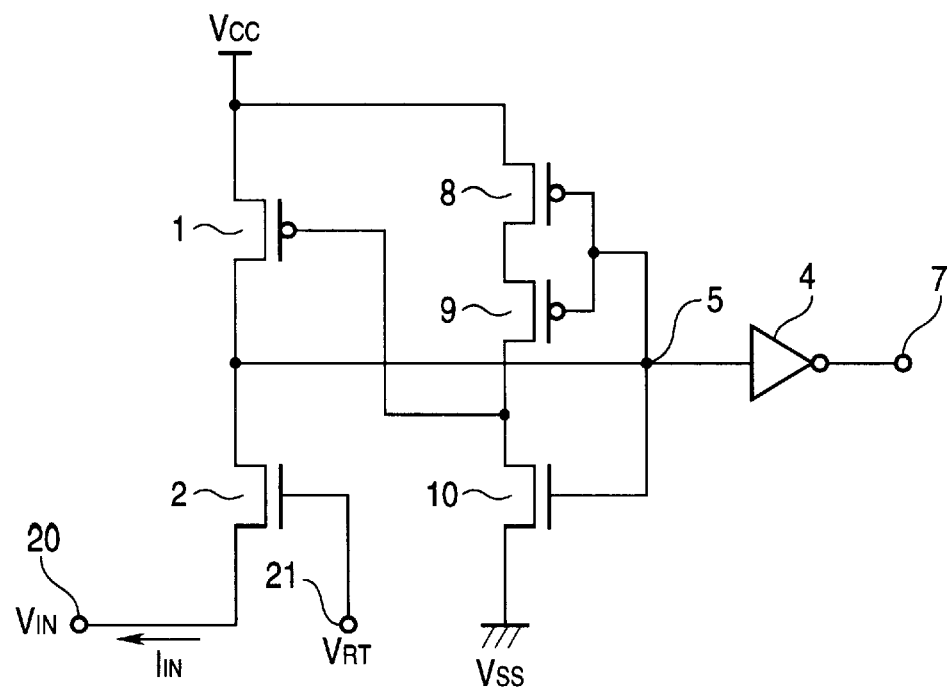
FIG. 5 is a detailed circuit diagram of the first embodiment of the input circuit shown in FIG. 4.

Referring to FIG. 5 is a detailed circuit diagram of the first embodiment of the input circuit shown in FIG. 4. In FIG. 5, elements corresponding to those shown in FIG. 4 are given the same reference numerals, and explanation thereof will be omitted for simplification of description.

Namely, as seen from comparison between FIGS. 4 and 5, the inverter 3 is constituted of an nMOS transistor 10 having a gate connected to the node 5, a source connected to the ground $V_{SS}$, and a drain connected to the gate of the pMOS transistor 1, and two pMOS transistors 8 and 9 connected in series between the power supply voltage $V_{CC}$ and the gate of the pMOS transistor 1, and having respective gates connected in common to the node 5.

Figure 1:
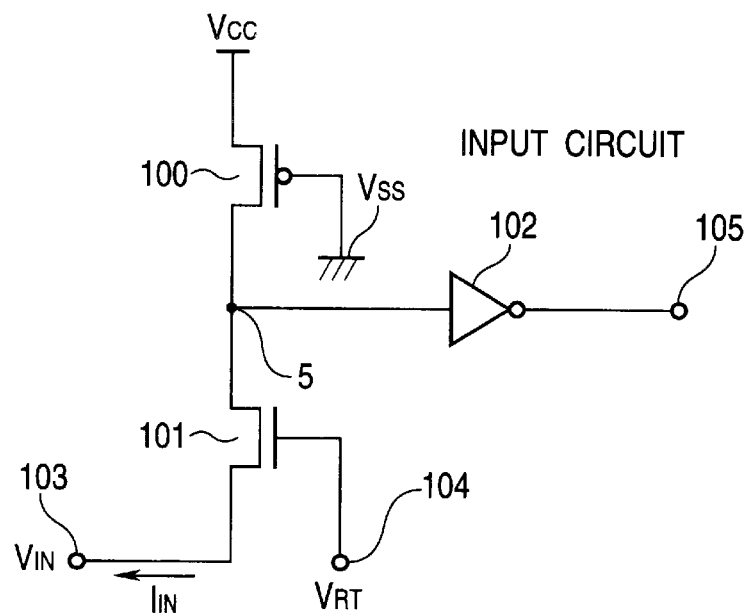
FIG. 1 is a circuit diagram of the prior art input circuit.
Figure 2:
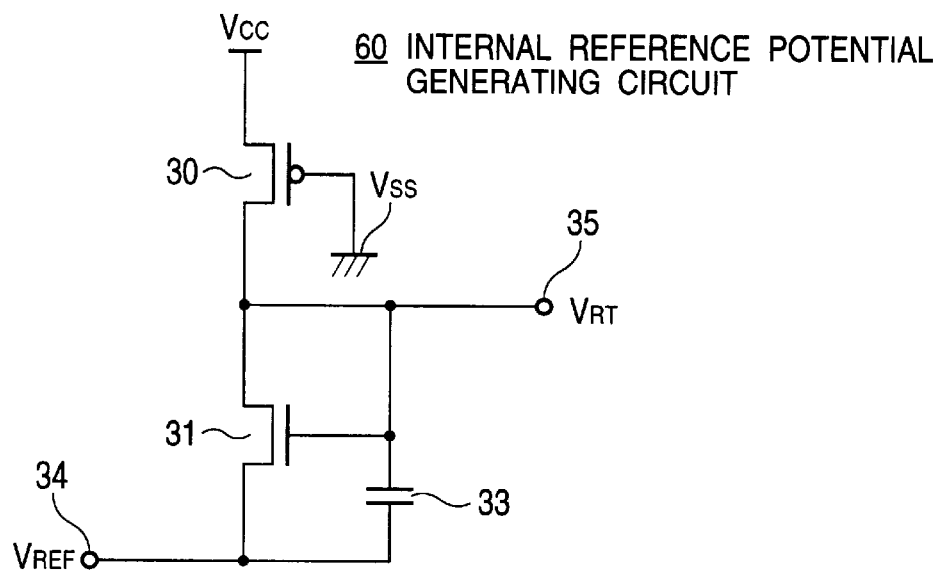
FIG. 2 is a circuit diagram of the internal reference potential generating circuit used for supplying the internal reference potential to the input circuit shown in FIG. 1.
Figure 3A:
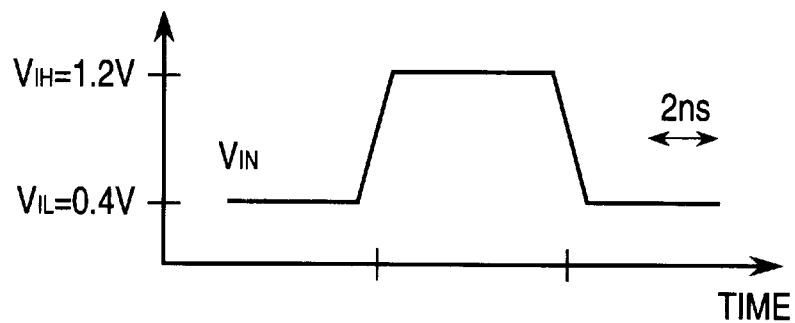
FIGS. 3A, 3B and 3C are waveform diagrams illustrating the voltages and the current on various points in the input circuit shown in FIG. 1.
Figure 3B:
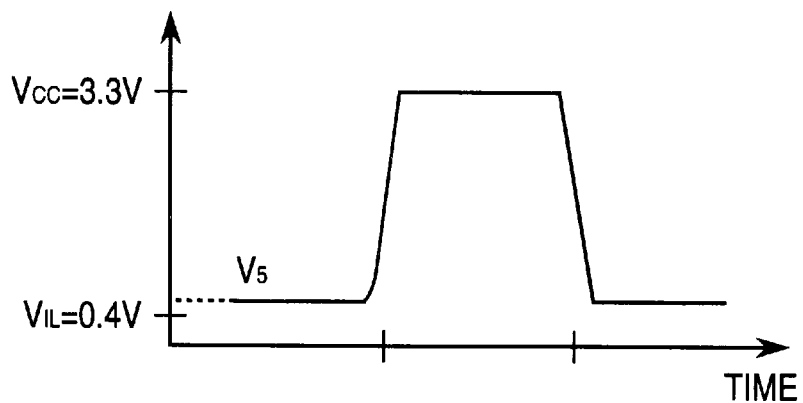
Figure 3C:
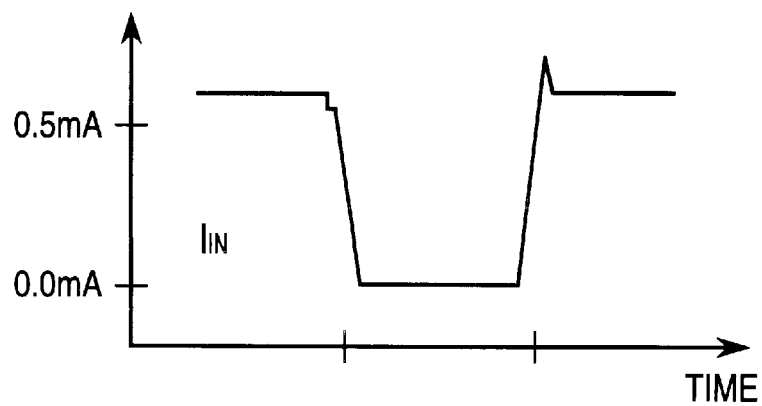

The following is an example of the particulars of the embodiment shown in FIG. 5, including the internal reference potential generating circuit 60 as shown in FIG. 2. The power supply voltage $V_{CC}$=3.3 V, the ground voltage $V_{SS}$=0 V, the reference voltage $V_{REF}$=0.8 V, the input high level $V_{IH}$/the input low level $V_{IL}$=1.2 V/0.4 V, the threshold of pMOS transistor=−0.8 V, and the threshold of nMOS transistor=0.8 V. The ratio of gate length to gate width in the pMOS transistor 1 and 30 is 1:8. The ratio of gate length to gate width in the pMOS transistor 8 and 9 is 1:4. The ratio of gate length to gate width in the nMOS transistors 2 and 10 is 1:40. The ratio of gate length to gate width in the nMOS transistor 31 is 1:4. All the pMOS and nMOS transistors have the same gate length. The capacitor 33 has a capacitance of 1 pF.

With this arrangement, it is designed that the source-gate voltage of the nMOS transistor 2 receiving the transmission signal is 1 V for example, and that the drain voltage of the nMOS transistor 2 swings around $V_{CC}/2$=1.65 V. Since it is also designed that the nMOS transistor operates in a pentode region, namely, in a region having a high transconductance gm and the nMOS transistor has a high cutoff frequency, a high gain and a high bandwidth product can be obtained.

Figure 6A:
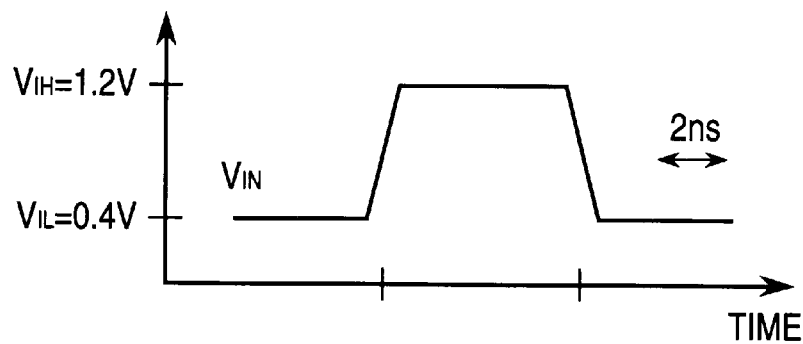
FIGS. 6A, 6B and 6C are waveform diagrams illustrating the voltages and the current on various points in the input circuit shown in FIG. 5.
Figure 6B:
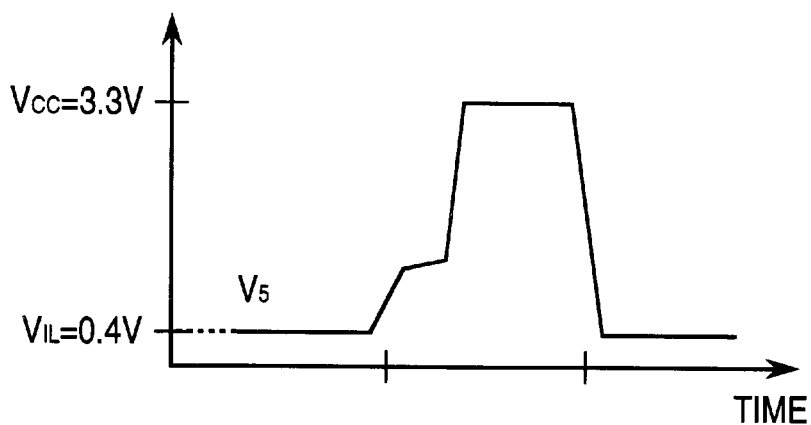
Figure 6C:
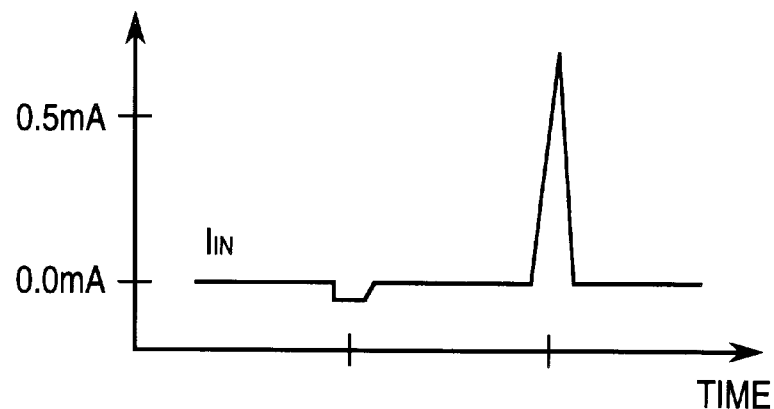

Now, operation of the circuit shown in FIG. 5 will be described with reference to FIGS. 6A, 6B and 6C. FIG. 6A illustrates the input voltage $V_{IN}$ on the transmission signal input terminal 20, and FIG. 6B illustrates the voltage $V_5$ on the mode 5. FIG. 6C illustrates the input current $I_{IN}$ flowing through the transmission signal input terminal 20.

First, it is assumed that the transmission signal $V_{IN}$=0.4 V namely, the transmission signal $V_{IN}$ is at a low level. In this condition, the nMOS transistor 2 is in an ON condition, and therefore, the potential $V_5$ on the node 5 is 0.4 V equal to the potential $V_{IN}$ of the transmission signal, namely, at the low level. At this time, since the pMOS transistor 1 is off, the input current $I_{IN}$ is 0 $\mu$A.

If the transmission signal $V_{IN}$ changes toward 1.2 V, namely, the high level, the potential of the node 5 elevates to follow the transmission signal $V_{IN}$. If the potential of the node 5 exceeds 0.8 V, the nMOS transistor 10 is turned on, so that the gate potential of the pMOS transistor 1 drops from the power supply voltage of 3.3 V. If the pMOS transistor 9 was not provided, since a gate-source voltage of the pMOS transistor 8 is around a value which is slightly smaller than 2.5 V, the pMOS transistor 8 is conductive, with the result that the gate potential of the pMOS transistor 1 does not drop until the pMOS transistor 1 is turned completely on. In this embodiment, however, since the pMOS transistors 8 and 9 are provided, the gate potential of the pMOS transistor 1 drops completely, so that the pMOS transistor 1 is turned completely on. On the other hand, since the nMOS transistor 2 is turned off, the potential of the node 5 abruptly elevates to reach the power supply voltage $V_{CC}$, namely, to become the high level.

Thereafter, if the transmission signal $V_{IN}$ changes toward 0.4 V, namely, the low level, the nMOS transistor 2 is turned on. Since the circuit parameters are so designed that the nMOS transistor 2 can carry a current which is larger than that flowing through the pMOS transistor 1 as mentioned above, the potential of the node 5 abruptly drops from the power supply voltage $V_{CC}$. Therefore, the pMOS transistors 8 and 9 are turned on, and the nMOS transistor 10 is turned off, so that the gate potential of the pMOS transistor 1 elevates to become 3.3 V. Accordingly, the pMOS transistor 1 is turned off. As a result, the potential on the node 5 finally drops to the potential of 0.4 V, which is equal to the level of the transmission signal.

As mentioned above, not only when the transmission signal is at the high level, but also when the transmission signal is at the low level, either the pMOS transistor 1 or the nMOS transistor 2 is turned off, so that no steady input current $I_{IN}$ flows. Of course, since either the pMOS transistors 8 and 9 or the nMOS transistor 10 is turned off, no pass-through current flows.

In the first embodiment shown in FIG. 5, the power supply voltage $V_{CC}$ is 3.3 V, and the two pMOS transistors 8 and 9 are provided. However, in the case that the power supply voltage $V_{CC}$ is 2.5 V, even if the pMOS transistor 9 was omitted, the circuit can operate normally. The reason for this is that when the potential of the node 1 changes from the low level to the high level, the source-gate voltage of the pMOS transistor 8 becomes small by the magnitude corresponding to the difference 0.8 V between the two power supply voltages 3.3 V and 2.5 V.

Figure 7:
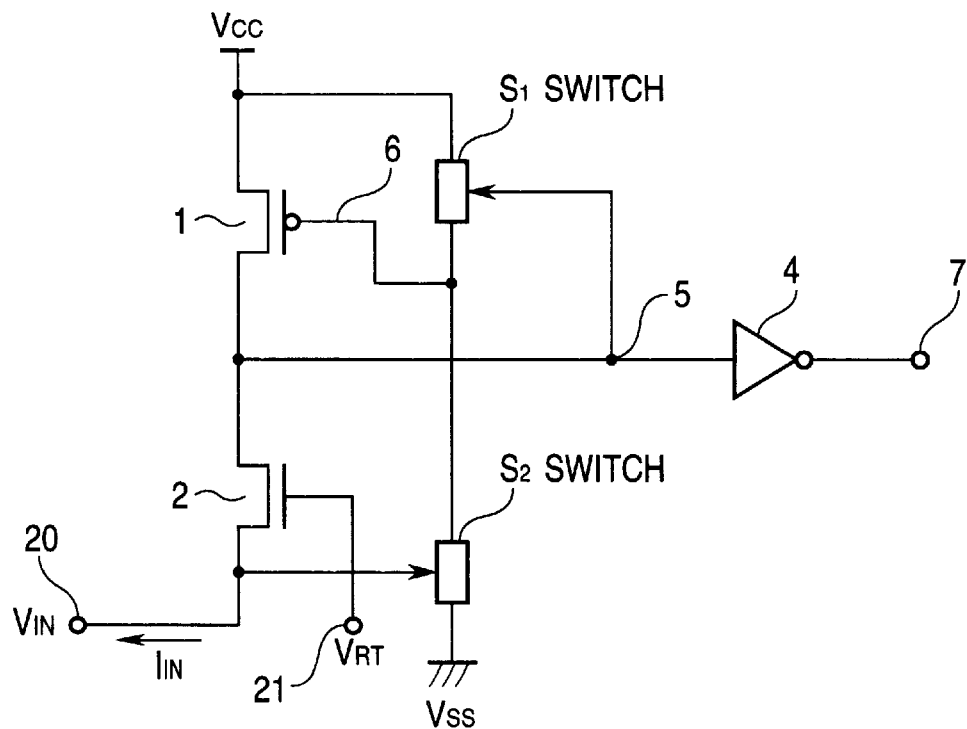
FIG. 7 is a circuit diagram of a second embodiment of the input circuit in accordance with the present invention.

Referring to FIG. 7, there is shown a circuit diagram of a second embodiment of the input circuit in accordance with the present invention. In FIG. 7, element corresponding to those shown in FIG. 4 are given the same reference numerals, and explanation thereof will be omitted.

As seen from comparison between FIGS. 4 and 7, the second embodiment is characterized in that, in addition to the nMOS transistor 2, the pMOS transistor 1 and the inverter 4, the means for controlling the gate of the pMOS transistor 1 is composed of a first switch $S_1$ connected between the power supply voltage $V_{CC}$ and a node 6 connected to the gate of the pMOS transistor 1 and controlled by the potential of the node 5 for connecting and disconnecting between the power supply voltage $V_{CC}$ and the node 6, and a second switch $S_2$ connected between the ground voltage $V_{SS}$ and the node 6 and controlled by the transmission signal $V_{IN}$ for connecting and disconnecting between the ground voltage $V_{SS}$ and the node 6.

Now, operation of the second embodiment will be described. When the transmission signal is brought into a low level (lower than the reference voltage $V_{REF}$), the nMOS transistor 2 is turned on, and the switch $S_2$ is turned off. Therefore, the potential of the node 5 lowers, and the switch $S_1$ is turned on. Accordingly, the potential of the node 6 becomes a high level, so that the pMOS transistor 1 is rendered off. As a result, the potential of the node 5 becomes equal to the low level of the transmission signal. The inverter 4 outputs the high level signal. At this time, since the pMOS transistor 1 is off, no steady input current $I_{IN}$ flows.

Then, if the transmission signal is brought into a high level (higher than the reference voltage $V_{REF}$), the switch $S_2$ is turned on. Therefore, the potential of the node 6 lowers. At the moment the potential of the node 6 drops from $V_{CC}$ by the magnitude corresponding to the threshold (for example, 0.8 V) of the pMOS transistor, the pMOS transistor 1 is turned on. On the other hand, since the nMOS transistor 2 is rendered off, the potential of the node 5 goes completely to a high level, so that the switch $S_1$ is turned off. As a result, the inverter 4 outputs the low level signal. At this time, since the nMOS transistor 2 is off, no steady input current $I_{IN}$ flows.

As mentioned above, the potential of the node 6 is controlled by turning on and off the switch $S_2$ directly by the transmission signal. Therefore, in the input circuit of the second embodiment, the potential of the node 5 elevates more quickly than in the input circuit of the first embodiment.

Figure 8:
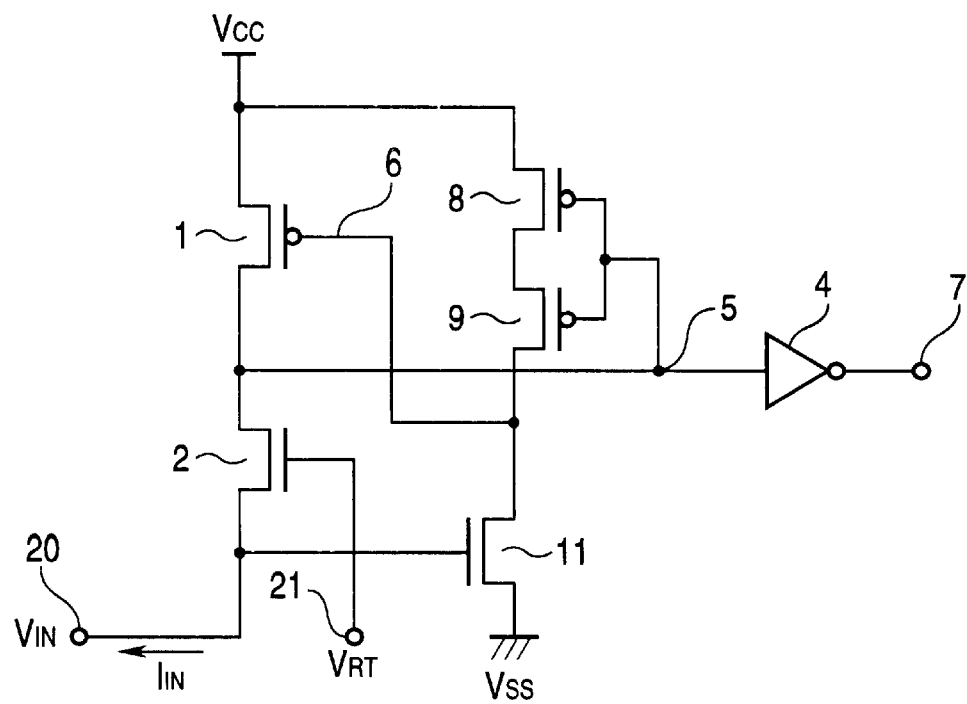
FIG. 8 is a detailed circuit diagram of the second embodiment of the input circuit shown in FIG. 7.

Referring to FIG. 8, there is shown a detailed circuit diagram of the second embodiment of the input circuit shown in FIG. 7. In FIG. 8, element corresponding to those shown in FIGS. 5 and 7 are given the same reference numerals. As seen from comparison between FIGS. 7 and 8, the first switch $S_1$ is composed of two series-connected pMOS transistors 8 and 9, and the second switch $S_2$ is composed of an nMOS transistor 11 having a gate connected to the transmission signal input terminal 20. This nMOS transistor 11 has the same gate length to width ratio as that of the nMOS transistor 10. The circuit parameters and the power supply voltage are the same as those of the detailed circuit example of the first embodiment.

Now, operation of the detailed circuit example of the second embodiment shown in FIG. 8 will be described.

When the transmission signal $V_{IN}$ is at the low level (0.4 V), the nMOS transistor 2 is in an ON condition, and the potential of the node 5 is equal to the potential of the transmission signal. Of course, the input current $I_{IN}$ is 0 $\mu$A.

If the transmission signal $V_{IN}$ changes toward the high level (1.2 V), the nMOS transistor 11 is turned on, and the potential of the node 6 drops from the power supply voltage $V_{CC}$(=3.3 V). Therefore, the pMOS transistor 1 is turned on. On the other hand, since the nMOS transistor 2 is turned off, the potential of the node 5 changes toward the power supply voltage $V_{CC}$. Of course, since the nMOS transistor 2 is off, no steady current $I_{IN}$ flows.

In the second embodiment shown in FIG. 8, the power supply voltage $V_{CC}$ is 3.3 V, and the two pMOS transistors 8 and 9 are provided. However, in the case that the power supply voltage $V_{CC}$ is 2.5 V, even if the pMOS transistor 9 was omitted, the circuit can operate normally.

Figure 9:
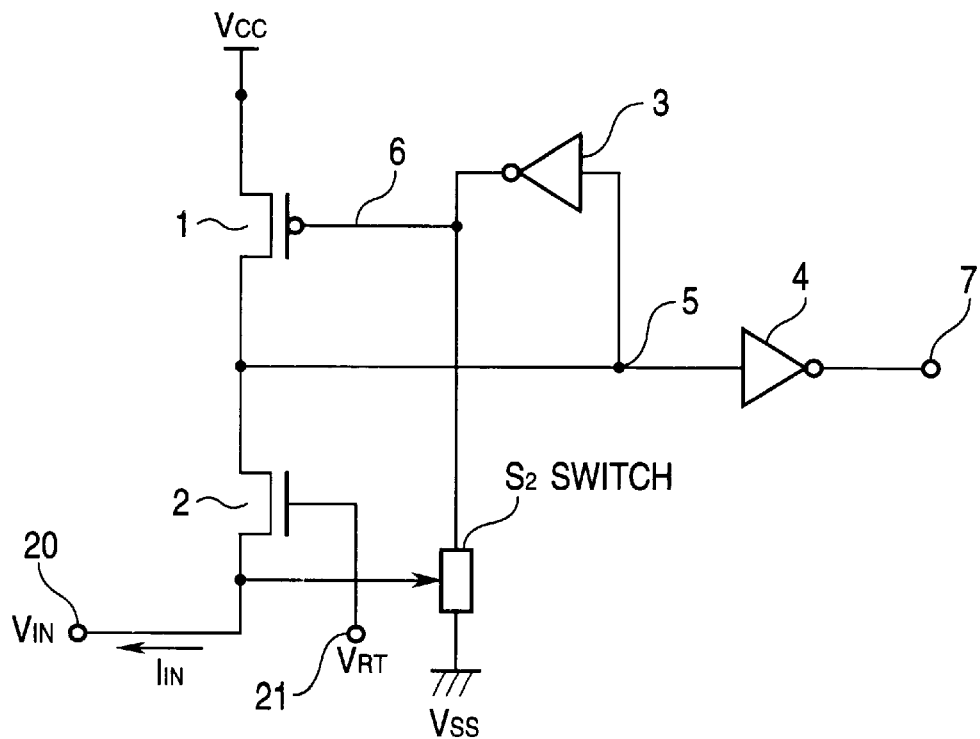
FIG. 9 is a circuit diagram of a third embodiment of the input circuit in accordance with the present invention.

Referring to FIG. 9, there is shown a circuit diagram of a third embodiment of the input circuit in accordance with the present invention. In FIG. 9, element corresponding to those shown in FIG. 4 are given the same reference numerals, and explanation thereof will be omitted.

As seen from comparison between FIGS. 4 and 9, the third embodiment is characterized in that, in addition to the nMOS transistor 2, the pMOS transistor 1 and the inverter 4, the means for controlling the gate of the pMOS transistor 1 is composed of the inverter 3 having the input connected to the node 5 and the output connected to a node 6 connected to the gate of the pMOS transistor 1 and a second switch $S_2$ connected between the ground voltage $V_{SS}$ and the node 6 and controlled by the transmission signal $V_{IN}$ for connecting and disconnecting between the ground voltage $V_{SS}$ and the node 6.

Now, operation of the third embodiment will be described. When the transmission signal is brought into the low level, the nMOS transistor 2 is turned on, so that the potential of the node 5 lowers. Furthermore, the switch $S_2$ is turned off. Therefore, the potential of the node 6 becomes a high level, so that the pMOS transistor 1 is rendered off. As a result, the potential of the node 5 becomes equal to the low level of the transmission signal. The inverter 4 outputs the high level signal. At this time, since the pMOS transistor 1 is off, no steady input current $I_{IN}$ flows.

Then, if the transmission signal is brought into the high level (higher than the reference voltage $V_{REF}$), the switch $S_2$ is turned on. Therefore, the potential of the node 6 lowers. At the moment the potential of the node 6 drops from $V_{CC}$ by the magnitude corresponding to the threshold of the pMOS transistor 1, the pMOS transistor 1 is turned on. On the other hand, since the nMOS transistor 2 is rendered off, the potential of the node 5 elevates to the high level, so that the inverter 3 outputs the low level signal. As a result, the potential of the node 6 goes completely to the low level, so that the pMOS transistor 1 is turned completely on. Since the nMOS transistor 2 is off, the potential of the node 5 completely elevates to the high level. As a result, the inverter 4 outputs the low level signal. At this time, of course, since the nMOS transistor 2 is off, no steady input current $I_{IN}$ flows.

As mentioned above, when the switch $S_2$ is turned on directly by the transmission signal, the potential of the node 6 starts to drop, and thereafter, is caused to further drop by action of the inverter 3. Therefore, in the input circuit of the third embodiment, the potential of the node 5 elevates more quickly than the input circuit of the first and second embodiments.

Figure 10:
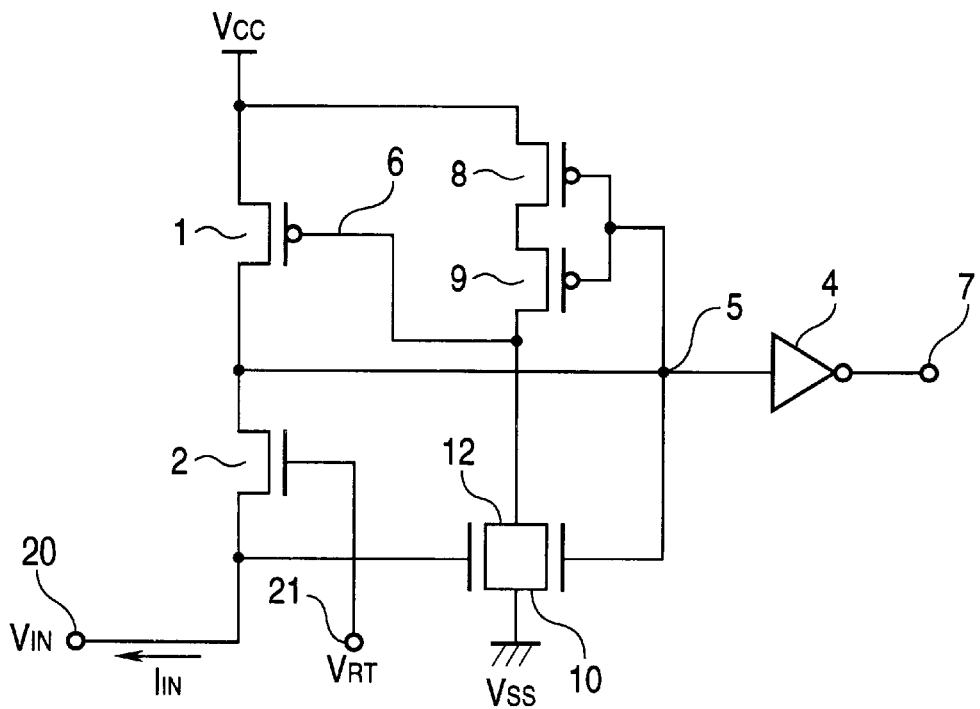
FIG. 10 is a detailed circuit diagram of the third embodiment of the input circuit shown in FIG. 9.

Referring to FIG. 10, there is shown a detailed circuit diagram of the third embodiment of the input circuit shown in FIG. 9. In FIG. 10, element corresponding to those shown in FIGS. 5 and 9 are given the same reference numeral. As seen from comparison between FIGS. 9 and 10, the inverter 3 is composed of two series-connected pMOS transistors 8 and 9 and the nMOS transistor 10, and the second switch $S_2$ is composed of an nMOS transistor 12 having a gate connected to the transmission signal input terminal 20. The circuit parameters and the power supply voltage are the same as those of the detailed circuit example of the first embodiment. The nMOS transistor 12 has the same gate length to width ratio as that of the nMOS transistor 11, namely, 1:4.

Now, operation of the detailed circuit example of the third embodiment shown in FIG. 10 will be described.

When the transmission signal $V_{IN}$ is at the low level (0.4 V), the nMOS transistor 2 is in an ON condition, and the potential of the node 5 is equal to the potential of the transmission signal.

If the transmission signal $V_{IN}$ changes toward the high level (1.2 V), the nMOS transistor 12 is turned on, and therefore, the potential of the node 6 drops from the power supply voltage $V_{CC}$ (=3.3 V). Accordingly, the pMOS transistor 1 is turned on. On the other hand, since the nMOS transistor 2 is turned off, the potential of the node 5 changes toward the power supply voltage $V_{CC}$. At this time, since the pMOS transistors 8 and 9 are turned off and the nMOS transistor 10 is turned on, the potential of the node 6 is brought to 0 V, and the potential of the node 5 is caused to change to the power supply voltage $V_{CC}$. By this action, the change of the node 5 to the high level is faster than the first and second embodiments.

Figure 11A:
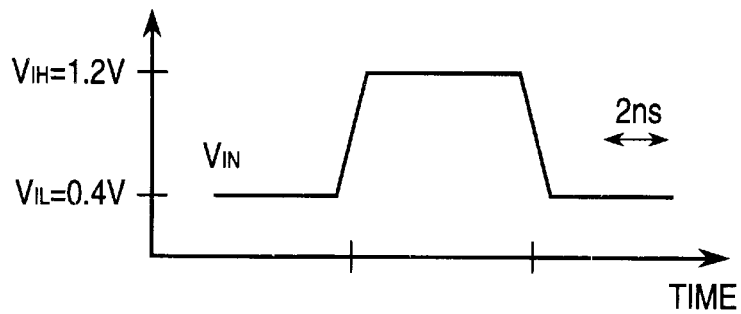
FIGS. 11A and 11B are waveform diagrams illustrating the voltages on two points in the first, second and third embodiments of the input circuit in accordance with the present invention.
Figure 11B:
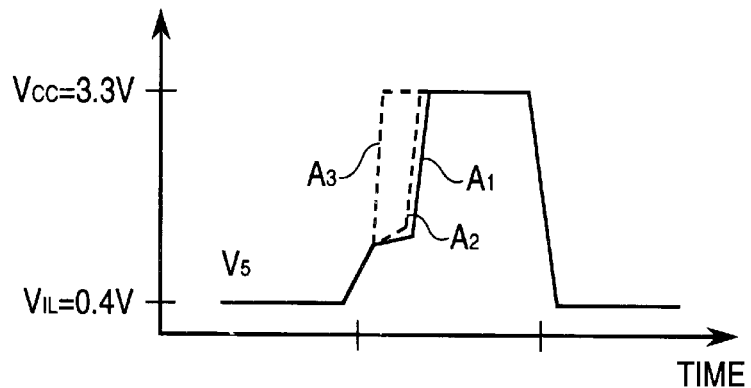

Referring to FIGS. 11A and 11B, there are shown a waveform diagram of the transmission signal $V_{IN}$ and a waveform diagram of the potential $V_5$ on the node 5 in the first, second and third embodiments of the input circuit. In FIG. 11B, "A1" shows the waveform diagram of the potential $V_5$ on the node 5 in the specific example of the first embodiment shown in FIG. 5, and "A2" shows the waveform diagram of the potential $V_5$ on the node 5 in the specific example of the second embodiment shown in FIG. 8. "A3" shows the waveform diagram of the potential $V_5$ on the node 5 in the specific example of the third embodiment shown in FIG. 10.

As seen from FIGS. 11A and 11B, the elevation of the potential on the node 5 is faster in the specific example of the second embodiment than in the specific example of the first embodiment, and further, is faster in the specific example of the third embodiment than in the specific example of the second embodiment.

In the specific example of the third embodiment shown in FIG. 10, the power supply voltage $V_{CC}$ is 3.3 V, and the two pMOS transistors 8 and 9 are provided. However, in the case that the power supply voltage $V_{CC}$ is 2.5 V, even if the pMOS transistor 9 was omitted, the circuit can operate normally.

Figure 12:
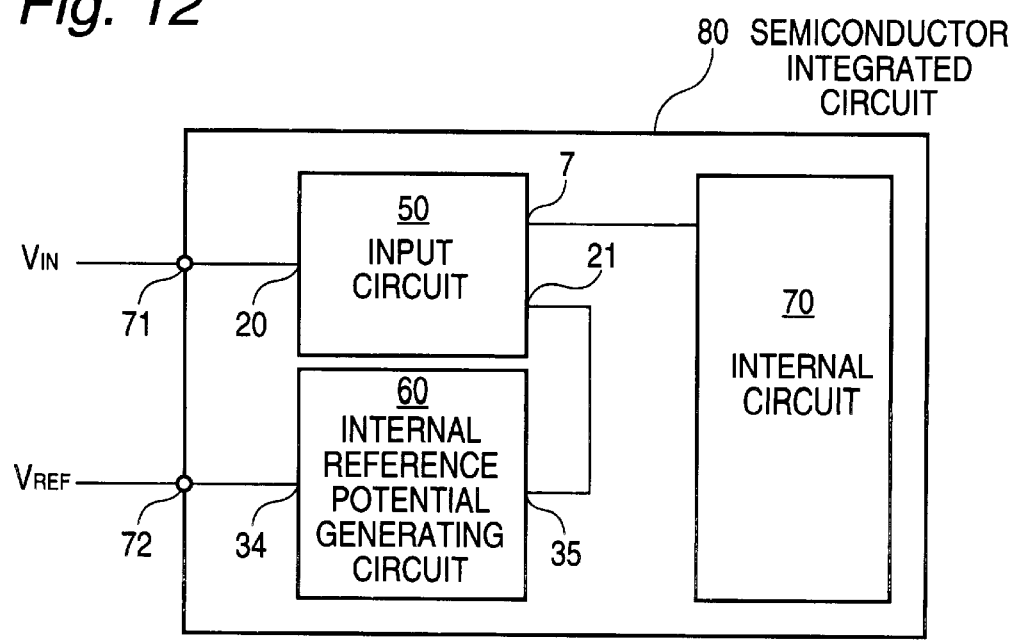
FIG. 12 is a block diagram of a semiconductor integrated circuit incorporating therein the input circuit in accordance with the present invention.

Referring to FIG. 12, there is shown a block diagram of a semiconductor integrated circuit incorporating therein the input circuit in accordance with the present invention. The input circuit 50 and the internal reference potential generating circuit 60 are provided in the same semiconductor integrated circuit 80, which also includes an internal circuit 70 connected to the output 7 of the input circuit 50, a transmission signal external input terminal 71 connected to the signal input 20 of the input circuit 50, and a reference voltage external input terminal 72 connected to the reference voltage input terminal 34 of the internal reference potential generating circuit 60. The internal reference potential terminal 35 of the internal reference potential generating circuit 60 is connected to the internal reference potential terminal 21 of the input circuit 50.

The invention has thus been shown and described with reference to the specific embodiments. However, it should be noted that the present invention is in no way limited to the details of the illustrated structures but changes and modifications may be made within the scope of the appended claims. For example, a plurality of input circuits can be connected to one internal reference potential generating circuit.

As seen from the above, in the input circuit in accordance with the present invention, since no steady input current flows, the consumed current is small. In addition, when the transmission signal applied to the source of the source-input nMOS transistor is at the low level, the drain potential of the source-input nMOS transistor can be lowered to the potential equal to the transmission signal. This can give a large input margin to a succeeding stage.

I claim:

1. An input circuit provided in a semiconductor integrated circuit, comprising:

a first transistor of a first conductivity type connected between an input node receiving a transmission signal and a first node and having a control electrode connected to a reference potential, a second transistor of a second conductivity type connected between a power supply voltage and said first node, said power supply voltage being different from said reference potential, an inverter having an input connected to said first node and an output connected to an output terminal, and means including at least one circuit component other than a conducting line and having an output coupled to a control electrode of said second transistor and responding to at least a potential on said first node for rendering said second transistor non-conductive when said first transistor is conductive, wherein said first transistor comprises a first nMOS transistor having a source connected to said input node, a drain connected to said first node and a gate connected to said reference potential, and said second transistor comprises a first pMOS transistor having a source connected to said power supply voltage, a drain connected to said first node, and a gate connected to said output of said means, and wherein said means includes a first switch connected between ground and a second node connected to a gate of said first pMOS transistor and controlled by said transmission signal to connect and disconnect between said ground and said second node, and a second switch connected between said power supply voltage and said second node and controlled by said potential on said first node to connect and disconnect between said power supply voltage and said second node, so that when said first switch is in a closed condition, said second switch is in an open condition, and when said second switch is in a closed condition, said first switch is in an open condition.

2. An input circuit claimed in claim 1 wherein said first switch comprises a second nMOS transistor having a source connected to ground, a drain connected to said gate of said first pMOS transistor, and a gate connected to receive said transmission signal, and said second switch comprises at least one second pMOS transistor having a source connected to said power supply voltage, a drain connected to said gate of said first pMOS transistor, and a gate connected to said first node.

3. An input circuit provided in a semiconductor integrated circuit, comprising:

a first transistor of a first conductivity type connected between an input node receiving a transmission signal and a first node and having a control electrode connected to a reference potential, a second transistor of a second conductivity type connected between a power supply voltage and said first node, said power supply voltage being different from said reference potential, an inverter having an input connected to said first node and an output connected to an output terminal, and means including at least one circuit component other than a conducting line and having an output coupled to a control electrode of said second transistor and responding to at least a potential on said first node for rendering said second transistor non-conductive when said first transistor is conductive, wherein said first transistor comprises a first nMOS transistor having a source connected to said input node, a drain connected to said first node and a gate connected to said reference potential, and said second transistor comprises a first pMOS transistor having a source connected to said power supply voltage, a drain connected to said first node, and a gate connected to said output of said means, and wherein said means includes a first switch connected between ground and a second node connected to said gate of said first pMOS transistor and controlled by said transmission signal to connect and disconnect between said ground and said second node, and a second inverter having an input connected to said first node and an output connected to said gate of said first pMOS transistor, so that when said first switch is in a closed condition, said output of said second inverter is brought to a low level, and when said output of said second inverter is at a high level, said first switch is brought into an open condition.

4. An input circuit claimed in claim 3 wherein said first switch comprises a second nMOS transistor having a source connected to said ground, a drain connected to said gate of said first pMOS transistor, and a gate connected to receive said transmission signal, and wherein said second inverter comprises at least one second pMOS transistor having a source connected to said power supply voltage, a drain connected to said gate of said first pMOS transistor, and a gate connected to said first node, and a third pMOS transistor having a source connected to said ground, a drain connected to said gate of said first pMOS transistor, and a gate connected to said first node.

5. An input circuit provided in a semiconductor integrated circuit, comprising:

a first transistor of a first conductivity type connected between an input node receiving a transmission signal and a first node and having a control electrode connected to a reference potential, a second transistor of a second conductivity type connected between a power supply voltage and said first node, said power supply voltage being different from said reference potential, an inverter having an input connected to said first node and an output connected to an output terminal, and means including at least one circuit component other than a conducting line and having an output coupled to a control electrode of said second transistor and responding to at least a potential on said first node for rendering said second transistor non-conductive when said first transistor is conductive, wherein said means includes a first switch connected between ground and a second node connected to said control electrode of said second transistor and controlled by said transmission signal to connect and disconnect between said ground and said second node, and a second switch connected between said power supply voltage and said second node and controlled by said potential on said first node to connect and disconnect between said power supply voltage and said second node, so that when said first switch is in a closed condition, said second switch is in an open condition, and when said second switch is in a closed condition, said first switch is in an open condition.

6. An input circuit provided in a semiconductor integrated circuit, comprising:

a first transistor of a first conductivity type connected between an input node receiving a transmission signal and a first node and having a control electrode connected to a reference potential, a second transistor of a second conductivity type connected between a power supply voltage and said first node, said power supply voltage being different from said reference potential, an inverter having an input connected to said first node and an output connected to an output terminal, and means including at least one circuit component other than a conducting line and having an output coupled to a control electrode of said second transistor and responding to at least a potential on said first node for rendering said second transistor non-conductive when said first transistor is conductive, wherein said means includes a first switch connected between ground and a second node connected to said control electrode of said second transistor and controlled by said transmission signal to connect and disconnect between the ground and said second node, and a second inverter having an input connected to said first node and an output connected to said control electrode of said second transistor, so that when said first switch is in a closed condition, said output of said second inverter is brought to a low level, and when said output of said second inverter is at a high level, said first switch is brought into an open condition.

7. An input circuit provided in a semiconductor integrated circuit, comprising:

a first transistor of a first conductivity type connected between an input node receiving a transmission signal and a first node and having a control electrode connected to a reference potential, a second transistor of a second conductivity type connected between a power supply voltage terminal and said first node, said power supply voltage being different from said reference potential, an inverter having an input connected to said first node and an output connected to an output terminal, and means including at least one circuit component other than a conducting line and having an output connected to a control electrode of said second transistor and responding to at least a potential on said first node for causing said potential of said first node to be equal to that of said transmission signal when said transmission signal is at a first level, wherein said first transistor comprises a first nMOS transistor having a source connected to said input node, a drain connected to said first node and a gate connected to said reference potential, and said second transistor comprises a first pMOS transistor having a source connected to said power supply voltage, a drain connected to said first node, and a gate connected to said output of said means, and wherein said means includes a first switch connected between ground and a second node connected to a gate of said first pMOS transistor and controlled by said transmission signal to connect and disconnect between said ground and said second node, and a second switch connected between said power supply voltage and said second node and controlled by said potential on said first node to connect and disconnect between said power supply voltage and said second node, so that when said first switch is in a closed condition, said second switch is in an open condition, and when said second switch is in a closed condition, said first switch is in an open condition.

8. An input circuit claimed in claim 7 wherein said first switch comprises a second nMOS transistor having a source connected to ground, a drain connected to said gate of said first pMOS transistor, and a gate connected to receive said transmission signal, and said second switch comprises at least one second pMOS transistor having a source connected to said power supply voltage, a drain connected to said gate of said first pMOS transistor, and a gate connected to said first node.

9. An input circuit provided in a semiconductor integrated circuit, comprising:

a first transistor of a first conductivity type connected between an input node receiving a transmission signal and a first node and having a control electrode connected to a reference potential, a second transistor of a second conductivity type connected between a power supply voltage terminal and said first node, said power supply voltage being different from said reference potential, an inverter having an input connected to said first node and an output connected to an output terminal, and means including at least one circuit component other than a conducting line and having an output connected to a control electrode of said second transistor and responding to at least a potential on said first node for causing potential of said first node to be equal to that of said transmission signal when said transmission signal is at a first level, wherein said first transistor comprises a first nMOS transistor having a source connected to said input node, a drain connected to said first node and a gate connected to said reference potential, and said second transistor comprises a first pMOS transistor having a source connected to said power supply voltage, a drain connected to said first node, and a gate connected to said output of said means, and wherein said means includes a first switch connected between ground and a second node connected to said gate of said first pMOS transistor and controlled by said transmission signal to connect and disconnect between said ground and said second node, and a second inverter having an input connected to said first node and an output connected to said gate of said first pMOS transistor, so that when said first switch is in a closed condition, said output of said second inverter is brought to a low level, and when said output of said second inverter is at a high level, said first switch is brought into an open condition.

10. An input circuit claimed in claim 9 wherein said first switch comprises a second nMOS transistor having a source connected to said ground, a drain connected to said gate of said first pMOS transistor, and a gate connected to receive said transmission signal, and wherein said second inverter comprises at least one second pMOS transistor having a source connected to said power supply voltage, a drain connected to said gate of said first pMOS transistor, and a gate connected to said first node, and a third nMOS transistor having a source connected to said ground, a drain connected to said gate of said first pMOS transistor, and a gate connected to said first node.

* * * * *